United States Patent
Wong et al.

(10) Patent No.: US 8,872,194 B2
(45) Date of Patent: Oct. 28, 2014

(54) LIGHT EMITTING DEVICE WITH ENHANCED PRE-DIP AND METHOD OF MANUFACTURING THE SAME

(71) Applicant: Avago Technologies General IP (Singapoer) Pte. Ltd., Singapore (SG)

(72) Inventors: Kum Soon Wong, Kuala Lumpur (MY); Yean Chon Yaw, Penang (MY); Kit Lai Wong, Penang (MY)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 13/791,608

(22) Filed: Mar. 8, 2013

(65) Prior Publication Data
US 2014/0252385 A1  Sep. 11, 2014

(51) Int. Cl.
| H01L 27/15 | (2006.01) |
| H01L 31/12 | (2006.01) |
| H01L 33/00 | (2010.01) |
| H01L 33/56 | (2010.01) |
| H01L 33/60 | (2010.01) |
| H01L 33/64 | (2010.01) |

(52) U.S. Cl.
CPC .............. *H01L 33/641* (2013.01); *H01L 33/56* (2013.01); *H01L 33/60* (2013.01)
USPC ............. 257/79; 257/292; 257/293; 257/771; 257/E21.006; 257/E21.007; 257/E21.053; 257/E21.134; 257/E21.264; 257/E21.267; 257/E21.329; 257/E21.352

(58) Field of Classification Search
USPC ........... 257/79, 183, 291, 292, 293, 431, 771; 438/91, 99, 141
See application file for complete search history.

(56) References Cited

U.S. PATENT DOCUMENTS

| 5,860,735 | A  | * | 1/1999  | Keech ........................... 362/507 |
| 7,145,182 | B2 | * | 12/2006 | Peh ................................. 257/98 |
| 7,521,728 | B2 | * | 4/2009  | Andrews ....................... 257/100 |
| 2004/0000727 | A1 | * | 1/2004  | Hsu ................................ 257/787 |
| 2007/0034887 | A1 | * | 2/2007  | Pang et al. ...................... 257/98 |

OTHER PUBLICATIONS

Brukilacchio et al., "Beyond the Limitations of Today's LED Packages: Optimizing High Brightness LED Performance by a Comprehensive Systems Design Approach", Innovations in Optics, Inc., 12 pages.
"Honeywell Solutions for HB/UHB LED Devices", LED Packaging Solutions, Honeywell Electronic Materials, Honeywell International Inc., 2010, 8 pages.
Fukuda, Kazumasa, "Thermally Conductive Metal Substrate", Hitachi Chemical Technical Report No. 54, Hitachi Chemical, 2 pages.
EPO-TEK H65-175MP Technical Data Sheet, Epoxy Technology, Epoxy Technology, Inc., May 2009, 1 page.

* cited by examiner

*Primary Examiner* — David Nhu

(57) ABSTRACT

An illumination device is disclosed. The illumination device includes a light source a pre-dip material that at least partially encapsulates the light source. The pre-dip material may include one or both of thermally-conductive particles and a cyclo-aliphatic composition. The pre-dip material may further include a resin and a hardener for the resin. Methods of manufacturing an illumination device are also disclosed.

20 Claims, 3 Drawing Sheets

LIGHT EMITTING DEVICE WITH ENHANCED PRE-DIP AND METHOD OF MANUFACTURING THE SAME

FIELD OF THE DISCLOSURE

The present disclosure is generally directed toward light emitting devices and packages for the same.

BACKGROUND

Light Emitting Diodes (LEDs) have many advantages over conventional light sources, such as incandescent, halogen, and fluorescent lamps. These advantages include longer operating life, lower power consumption, and smaller size. Consequently, conventional light sources are increasingly being replaced with LEDs in traditional lighting applications. As an example, LEDs are currently being used in flashlights, camera flashes, traffic signal lights, automotive taillights and display devices.

Two prevalent types of LED form factors are surface-mount LEDs and thru-hole LEDs. Surface-mount LEDs are particularly well suited for applications that require a low device height whereas thru-hole LEDs are better suited for focusing/directing light (e.g., for narrow viewing angle applications). Smaller thru-hole LEDs and smaller surface-mount LEDs are generally desired to accommodate the public's desire to have smaller electronic devices.

As the light sources (e.g., LED dies) become smaller to achieve the economic cost advantage, several unwanted side-effects occur. Specifically, when the size of the LED die is reduced, but the overall light output of the LED die is maintained substantially constant, the current density for the LED die increases. This increased current density will lead to a higher heat density in the area proximate to the light-emitting surface of the LED die. Secondly, the increased current density will lead to a high photon density in the area proximate to the light-emitting surface of the LED die. Unfortunately, this increase in heat density and photon density can have deleterious effects on the materials that surround the light-emitting surface of the LED die. As an example, as the materials surrounding the LED die become degraded much more rapidly when subjected to increased heat and/or photon densities. Ultimately, the breakdown of material(s) surrounding the LED die will cause the overall light output of the illumination device to decrease.

SUMMARY

It is, therefore, one aspect of the present disclosure to provide an illumination device that overcomes the above-noted shortcomings. In particular, embodiments of the present disclosure describe an illumination device having a light source that is at least partially surrounded by a pre-dip material. The pre-dip material may be constructed to withstand increased heat and/or photon outputs from the light source, thereby increasing the effective life of the pre-dip material and maintaining a desired light output for the illumination device.

In some embodiments, the pre-dip material disclosed herein may comprise one or more additives that help increase the overall thermal conductivity of the pre-dip material. For example, but without limitation, the pre-dip material may comprise one or more thermally-conductive particles that help increase the thermal conductivity of the pre-dip material. A particular example of a suitable additive that may be included in the pre-dip material is alumina or alumina particles. The alumina particles, if included in the pre-dip material, can help increase the overall thermal conductivity of the pre-dip material, thereby increasing the amount of area in the pre-dip material subjected to increased heat, but decreasing the heat density immediately surrounding the light-emitting surface of the light source. Ultimately, the decrease in heat density around the light-emitting surface of the light source will result in an increased effective life of the pre-dip material and the illumination device.

In some embodiments, the added alumina particles can help to increase the thermal conductivity of the pre-dip material. A traditional clear-type epoxy will have a typical thermal conductivity of 0.17 W/mk. An example of a typical alumina-added epoxy is manufactured by Inabata and distributed under part number EH1600G2. When alumina (e.g., ALO2) is added to the epoxy, the thermal conductivity can increase to 0.5-0.9 W/mk. An example of such an improved material is manufactured by Inabata and distributed under part number EH1600-ALO2. An epoxy may comprise a greater concentration of alumina particles to further increase the thermal conductivity to approximately 2.4 W/mK. An example of such an alumina-added material is manufactured by Namics and is distributed under part number XS8472-1. With the best-case scenario taken into account, this represents an enormous 14 times increase in thermal conductivity.

Additionally, when alumina in added to the pre-dip material, the effective heat dissipation area is enlarged. With normal illumination devices, the heat dissipation area is focused primarily on the top of the LED die (e.g., proximate to the light-emitting surface). However, with the addition of alumina in accordance with embodiments of the present disclosure, the heat dissipation area can be enlarged to effectively extend to the entire opening of the reflector cup that supports the light source (e.g., LED die). As an example, if Avago's HLMP-LB73 lamp is used for an example calculation, the heat dissipation area can increase by up to 17 times the size of the heat dissipation area if no alumina were included in the pre-dip.

Although the term "alumina" is used herein to refer to a type of thermally-conductive additive for a pre-dip material, it should be appreciated that materials or substances having similar thermal conductivity and electrical insulation properties can be used. Furthermore, aluminium oxide is a chemical compound of aluminium and oxygen with the chemical formula $Al2O3$. It is the most commonly occurring of several aluminium oxides, and specifically identified as aluminium (III) oxide. It is commonly called alumina, and may also be called aloxide, aloxite, or alundum depending on particular forms or applications. It commonly occurs in its crystalline polymorphic phase $\alpha$-$Al2O3$. Any of these forms of alumina can be used in the pre-dip material without departing from the scope of the present disclosure.

Alternatively or additionally, the pre-dip material may comprise one or more additives that help inhibit decay within the pre-dip material due to increased photon densities. As a non-limiting example, the pre-dip may comprise an additive that includes a cyclo-aliphatic chemical composition. The cyclo-aliphatic chemical composition may help decrease the damages incurred by the pre-dip material due to increased photon exposure. An example of a cyclo-aliphatic chemical composition that may be used to enhance the pre-dip material is described in U.S. Patent Publication No. US 2010/0048770 to Burckhardt, the entire contents of which are hereby incorporated herein by reference.

In some embodiments, an illumination device may comprise a pre-dip material which includes a combination of thermally-conductive particles (e.g., alumina) and a cycloaliphatic chemical composition. In some embodiments, the thermally-conductive particle and cyclo-aliphatic chemical composition may be mixed in the pre-dip material in equal parts (e.g., equal parts additive with a thermally-conductive particle and additive with a cyclo-aliphatic chemical composition). In some embodiments, the pre-dip material may comprise a greater amount of cyclo-aliphatic chemical composition than an additive having thermally-conductive particles (e.g., 1.5 times as much cyclo-aliphatic chemical composition, 2 times as much cyclo-aliphatic chemical composition, or more). The reason why the pre-dip material may comprise more cyclo-aliphatic chemical composition than thermally-conductive particles is that the thermally-conductive particles may, if too dense, begin to inhibit the light output by the illumination device. Specifically, there may be an upper limit on the amount of thermally-conductive particles that can be added to the pre-dip without negatively impacting the light output of the illumination device. Said another way, the addition of some thermally-conductive particles can help improve the thermal behavior of the pre-dip material, thereby increasing the life and long-term light output of the illumination device, but too many thermally-conductive particles may begin to negatively affect the light output.

In some embodiments, other than the additives (e.g., thermally-conductive particles and/or cyclo-aliphatic composition) described herein, the pre-dip material may substantially match or be similar to the outer encapsulant of the illumination device. The pre-dip material may be utilized to protect bonds between one or more wires and the light source and/or to prevent air bubbles from forming inside the reflector cup that contains the light source.

The present disclosure will be further understood from the drawings and the following detailed description. Although this description sets forth specific details, it is understood that certain embodiments of the invention may be practiced without these specific details. It is also understood that in some instances, well-known circuits, components and techniques have not been shown in detail in order to avoid obscuring the understanding of the invention.

BRIEF DESCRIPTION OF THE DRAWINGS

The present disclosure is described in conjunction with the appended figures.

DETAILED DESCRIPTION

The ensuing description provides embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims.

Furthermore, although the depicted illumination device corresponds to a thru-hole illumination device, embodiments of the present disclosure are not so limited. It should be appreciated that embodiments of the present disclosure may be applied to non-thru-hole illumination devices, such as surface mount devices and the like. The description of the thru-hole illumination device is intended to be for illustration purposes only and should not be construed as limiting in any sense.

Figure 1:
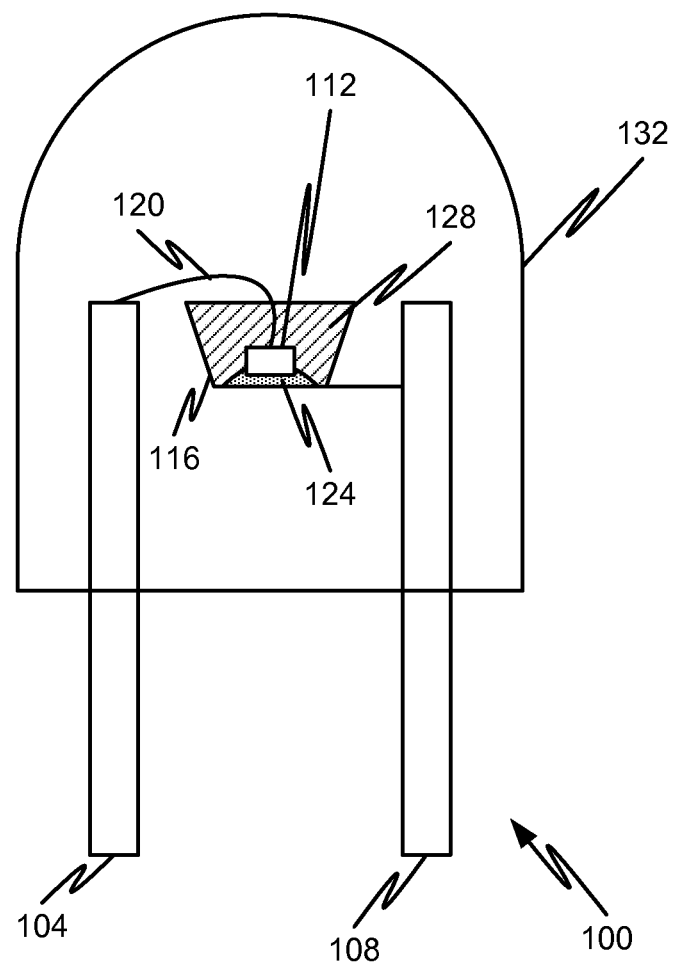
FIG. 1 is a cross-sectional view of a first illumination device in accordance with embodiments of the present disclosure.

With reference now to FIG. 1, details of a first illumination device 100 will be described in accordance with at least some embodiments of the present disclosure. The illumination device 100 may include a first lead 104 and second lead 108 that enable the illumination device 100 to be mounted in a thru-hole fashion to a Printed Circuit Board (PCB) or similar type of substrate that supports electronics. In some embodiments, the first lead 104 and second lead 108 are constructed of a conductive material such as metal, a conductive polymer, and/or a conductive composite. More specific examples of materials that may be used for the leads 104, 108 include, without limitation, lead, aluminum, copper, gold, silver, etc. In some embodiments, the leads 104, 108 comprise a substantially cylindrical or tubular shape and can be inserted into a hole on a PCB, for instance.

The leads 104, 108 may be partially encapsulated by an outer encapsulant 132 that protects the other electrically-conductive components of the illumination device 100. However, to facilitate mounting of the illumination device 100, at least some portion of the leads 104, 108 may be exposed outside of the outer encapsulant 132.

The other electrically-conductive components of the illumination device 100 may include one or more bonding wires 120 and a light source 112. Although only a single light source 112 is depicted and described herein, it should be appreciated that one, two, three, four, or more light sources 112 may be provided in a single illumination device without departing from the scope of the present disclosure.

In some embodiments, a structure is physically attached to one of the first lead 104 and second lead 108 to physically support the light source 112. In some embodiments, the support structure corresponds to a reflector cup 116 that may be physically attached to or integrated with one of the first lead 104 and/or second lead 108 and the reflector cup 116 may be used to physically support the light source 112. In more specific embodiments, the reflector cup 116 may comprise a substantially reflective material that may or may not be conductive. The reflector cup 116 may be shaped to help direct light emitted by the light source 112 toward a predetermined location (e.g., upward in the example depicted in FIG. 1). Even more specifically, the reflector cup 116 may comprise a particular shape that is used to maintain the light emission of the illumination device 100 within a predetermined angle (e.g., a particular viewing angle). As a non-limiting example, the reflector cup 116 may comprise a substantially conical shape that extends outwardly.

As noted above, the walls of the reflector cup 116 may comprise a reflective property that enables reflection of light emitted by the light source 112. In some embodiments, the walls of the reflector cup 116 may be made of a reflective material (e.g., metal, white polymer, etc.) or the walls of the reflector cup 116 may be coated with a reflective material.

The base of the reflector cup 116 may be configured to receive the light source 112 and, in some embodiments, may enable the light source 112 to be mounted thereto. In particular, the base of the reflector cup 116 may be substantially flat or planar such that the light source 112 can be positioned on the based of the reflector cup 116 and possible mounted or attached thereto.

In some embodiments, an adhesive 124 or the like (e.g., glue, die-attach paste, epoxy, etc.) may be used to secure the light source 112 to the base of the reflector cup 116. The adhesive 124 can be conductive or non-conductive depending upon the nature of the light source 112 and whether or not a conductive connection is desired between a bottom surface of the light source 112 and the bottom surface of the reflector cup 116.

In some embodiments, the light source 112 is configured to emit light of a predetermined wavelength or color. More specifically, the light source 112 may be configure to produce and emit light that is approximately blue (e.g., with a wavelength of approximately 450-495 nm). More specifically, the light source 112 may correspond to a Light Emitting Diode (LED) or LED die. The LED die may be configured to emit substantially blue light when current is passed therethrough (e.g., when the LED is activated with current flowing through one or both of the leads 104, 108). In the depicted example, the light source 112 corresponds to an LED having one of its anode and cathode on its top (light-emitting) surface and the other of its anode and cathode on its bottom (e.g., attachment) surface. In this particular embodiment, the reflector cup 116 may be utilized to carry current from a lead (e.g., second lead 108) to/from the light source 112. Current flowing from one lead to the other lead will pass through the light source 112 via the anode and cathode.

It should be appreciated that two bonding wires 120 may be utilized and both the anode and cathode of the light source 112 may be positioned on the top surface of the light source 112. One known way to manufacture such an LED is by flip-chip manufacturing processes. As a non-limiting example, the anode of the light source 112 may be electrically connected to the first lead 104 via a first bonding wire 120 and the cathode of the light source 112 may be electrically connected to second lead 108 via a second bonding wire 120.

As depicted in FIG. 1, the reflector cup 116 may be at least partially filled with a pre-dip material 128. In some embodiments, the pre-dip material 128 substantially covers the entirety of the light-emitting surface (e.g., top surface) of the light source 112. The pre-dip material 128 may be prepared such that it comprises at least one or more additives that enhance the light output of the illumination device 100 over time. Specifically, the pre-dip material 128 may comprise one or both of thermally-conductive particles (e.g., alumina) and a cyclo-aliphatic composition.

The thermally-conductive particles may be configured to conduct heat without conducting electricity. The thermally-conductive particles can enable the heat generated at the light-emitting surface of the light source 112 to be distributed through the pre-dip material 128 all the way to the top of the reflector cup 116. Since the surface area of the pre-dip material at the top of the reflector cup 116 is substantially larger than the surface area of the light-emitting surface of the light source 112, the heat density within the pre-dip material 128 is decreased near the light source 112, thereby increasing the light output by the illumination device 100 over time.

The cyclo-aliphatic composition within the pre-dip material 128 may be configured to increase the pre-dip material's 128 resistance to UV decay. Specifically, the photons emitted by the light source 112 can be distributed more uniformly throughout the pre-dip material 128 if the pre-dip material 128 is constructed to include the cyclo-aliphatic material.

In addition to the thermally-conductive particles and/or cyclo-aliphatic material, the pre-dip material 128 may also include a resin (e.g., resin A) as well as a hardener or curing agent for the resin (e.g., hardener for resin A). In the depicted embodiment, the pre-dip material 128 may be substantially devoid of phosphor, although embodiments of the present disclosure do contemplate configurations where some type of light-absorbing material may be provided in the pre-dip material 128. As shown in FIG. 1, the pre-dip material 128 may completely or substantially completely (e.g., within a machine tolerance) fill the entirety of the reflector cup 116, at least to a height sufficient to encapsulate the bonds between the wire(s) 120 and the light source 112.

The entirety of the pre-dip material 128 as well as the light source 112, reflector cup 116, and wire(s) 120 may further be encapsulated by the outer encapsulant 132. In some embodiments, the outer encapsulant 132 comprises a round or dome shape that provides a light-shaping or light-directing quality. Specifically, the outer encapsulant 132 may be provided to (1) help shape light emitted by the light source 112 as well as (2) protect the light source 112, wires 120, and other electrically-conductive components.

Figure 2:
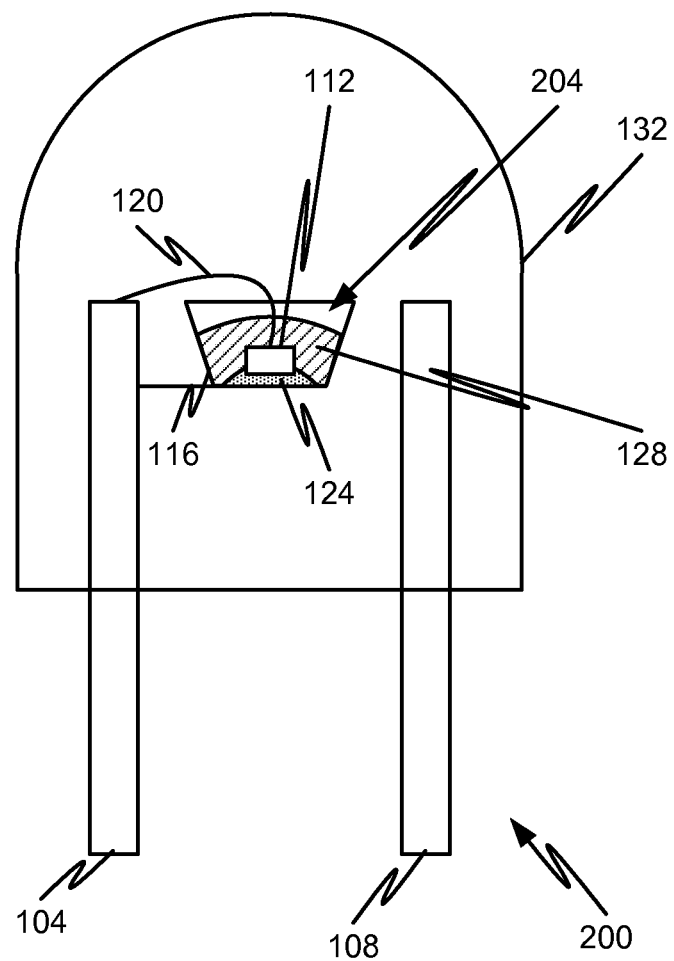
FIG. 2 is a cross-sectional view of a second illumination device in accordance with embodiments of the present disclosure.

In some embodiments, the outer encapsulant 132 is made of a clear or translucent material. More specifically, the outer encapsulant 132 may include, without limitation, epoxy, silicone, a hybrid of silicone and epoxy, glass, plastic, or combinations thereof. It may also be possible to include phosphor material in the outer encapsulant 132 without departing from the scope of the present disclosure. Specifically, the outer encapsulant 132 may comprise phosphor, a hybrid of phosphor and silicone, an amorphous polyamide resin or fluorocarbon, or combinations thereof FIG. 2 depicts another example of an illumination device 200, except that the illumination device 200 comprises a reflector cup 116 with at least a portion thereof 204 that is not filled with the pre-dip material 128. In some embodiments, the pre-dip material 128 may comprise a natural dome or lens shape (e.g., due to its inherent surface tension during the curing of the pre-dip material 128). Alternatively, the pre-dip material 128 may be cured such that its top surface is substantially flat or planar (e.g., parallel with the bottom surface of the reflector cup 116).

It should be appreciated that the pre-dip material 128 used in the illumination device 200 may be similar or identical to the pre-dip material 128 used in illumination device 100. The unfilled portion 204 of the reflector cup 116 may be left empty while the pre-dip material 128 is cured and then the unfilled portion 204 may be filled with the outer encapsulant 132 during later stages of manufacturing. Thus, the unfilled portion 204 may still be filled with a material other than air, such as encapsulant 132. The purpose of showing the unfilled portion 204 is to illustrate that the reflector cup 116 does not necessarily have to be completely filled with the pre-dip material 128. Partial filling of the reflector cup 116 with the pre-dip material 116 can help reduce the overall costs associated with manufacturing the illumination device 200 while still obtaining the advantages of the pre-dip material 128 vis-à-vis its interaction with the light source 112 during operation.

Figure 3:
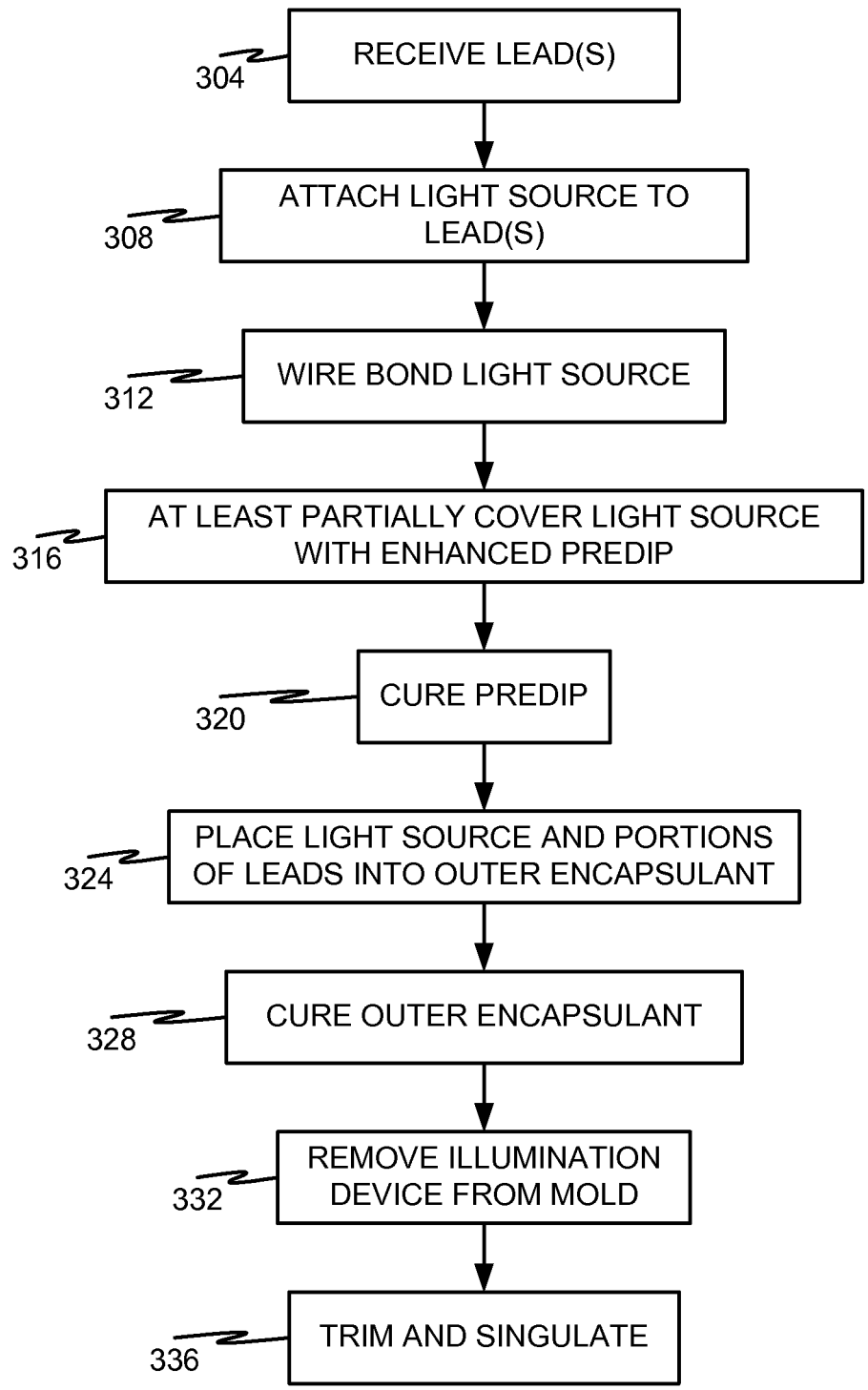
FIG. 3 is a flow chart depicting a method of manufacturing an illumination device in accordance with embodiments of the present disclosure.

With reference now to FIG. 3, an illustrative method of manufacturing an illumination device 100, 200 will be described in accordance with at least some embodiments of the present disclosure. While the method depicted in FIG. 3 is directed toward manufacturing a single illumination device 100, 200, it should be appreciated that the methods disclosed herein can be applied in batch manufacturing where the steps disclosed herein are performed substantially simultaneously on a plurality of illumination devices 100, 200. Moreover, although the steps of the method depicted in FIG. 3 are shown to be in a particular order, it should be appreciated that the order or steps can be changed, switched, replaced, or performed in parallel without departing from the scope of the present disclosure.

The method begins when the leads 104, 108 are received (step 304). The lead(s) 104, 108 are then attached to a light source 112 (step 308). In some embodiments, this step may comprise physically attaching the light source 112 to one of the leads 104, 108. Furthermore, this step may comprise placing the light source 112 into a reflector cup 116 that is attached to one or both of the leads 104, 108. Further still, the attachment step may comprise adhering, securing, or fixing the light source 112 to the bottom surface of the reflector cup 116 with an adhesive 124.

Before, after, or simultaneous with step 308, the light source 112 is electrically connected to one or both leads 104, 108 (step 312). In some embodiments, electrical connectivity can be achieved by wire bonding the anode and/or cathode of the light source 112 to one or both leads 104, 108. As discussed above, one or two wires 120 may be used for electrical connections.

The method continues with the addition of the pre-dip material 128 to the illumination device 100, 200 (step 316). Specifically, the pre-dip material 128 may be added into the reflector cup 116 such that it completely or partially fills the reflector cup 116. This step can be performed in one or multiple steps. As an example, the pre-dip material 128 having one or more additives (e.g., having thermally-conductive particles and/or a cyclo-aliphatic composition) can be pre-mixed and then injected or deposited into the reflector cup 116. As another example, a base epoxy can be placed into the reflector cup 116 and then one or more additives can be added to the base epoxy in the reflector cup 116.

After the reflector cup 116 has been at least partially filled with the pre-dip material 128, the method continues by curing the pre-dip material 128 (step 320). The curing of the pre-dip material 128 can be achieved in any number of ways. For instance, the pre-dip material 128 can be subjected to a predetermined heat, ultraviolet radiation, and/or the pre-dip material 128 can be exposed to air for a predetermined amount of time. While curing of the pre-dip material 128 helps to protect the light source 112 and its wire bonds from breaking during subsequent processing, it should be appreciated that the curing step 320 is an optional step.

The manufacture of the illumination device 100, 200 continues by placing the light source 112, the reflector cup 116, and portions of the leads 104, 108 into a liquid or malleable outer encapsulant 132 (step 324). The outer encapsulant 132 is then cured, thereby hardening the outer encapsulant 132 around the light source 112, reflector cup 116, and portions of the leads 104, 108 (step 328).

Once cured, the outer encapsulant 132 and the components contained therein can be removed from the mold that previously held the liquid or malleable outer encapsulant 132 (step 332) and the leads 104, 108 can be trimmed (step 336). Other steps that may be performed as part or after the trimming include singulation and polishing of the encapsulant 132.

Specific details were given in the description to provide a thorough understanding of the embodiments. However, it will be understood by one of ordinary skill in the art that the embodiments may be practiced without these specific details. For example, circuits may be shown in block diagrams in order not to obscure the embodiments in unnecessary detail. In other instances, well-known circuits, processes, algorithms, structures, and techniques may be shown without unnecessary detail in order to avoid obscuring the embodiments.

While illustrative embodiments of the disclosure have been described in detail herein, it is to be understood that the inventive concepts may be otherwise variously embodied and employed, and that the appended claims are intended to be construed to include such variations, except as limited by the prior art.

What is claimed is:

1. An illumination device, comprising:
   a light source comprising at least one light-emitting surface; and
   a pre-dip material that directly contacts at least a portion of the at least one light-emitting surface, the pre-dip material comprising at least one of thermally-conductive particles and a cyclo-aliphatic composition.

2. The illumination device of claim 1, wherein the pre-dip material comprises both thermally-conductive particles and the cyclo-aliphatic composition.

3. The illumination device of claim 2, wherein the pre-dip material further comprises a resin and a hardener for the resin.

4. The illumination device of claim 2, wherein the pre-dip material comprises a greater amount of cyclo-aliphatic composition as compared to the thermally-conductive particles.

5. The illumination device of claim 1, further comprising:
   a reflector cup in which the light source is positioned, wherein the pre-dip material at least partially fills the reflector cup.

6. The illumination device of claim 5, wherein the reflector cup is completely filled with the pre-dip material.

7. The illumination device of claim 1, wherein the pre-dip material comprises the thermally-conductive particles and wherein the pre-dip material is electrically insulative.

8. The illumination device of claim 7, wherein the thermally-conductive particles comprise alumina.

9. The illumination device of claim 7, wherein the pre-dip material comprises a thermal conductivity at least about 0.5 W/mK.

10. The illumination device of claim 7, wherein the pre-dip material comprises a thermal conductivity at least about 2.4 W/mK.

11. The illumination device of claim 1, further comprising:
    an outer encapsulant that substantially encapsulates the pre-dip material, the outer encapsulant comprising at least one of epoxy, silicone, a hybrid of silicone and epoxy, glass, and plastic.

12. The illumination device of claim 1, wherein the light source corresponds to a bare Light Emitting Diode (LED) die.

13. The illumination device of claim 1, further comprising at least one wire electrically connecting the light source to a lead of the illumination device, wherein the lead is configured for thru-hole mounting.

14. An illumination device configured for thru-hole mounting, the device comprising:
    a light source comprising at least one surface configured to emit photons when electrical current is provided to the light source;
    a first lead configured to carry electrical current to the light source; and
    a pre-dip material at least partially encapsulating and in direct contact with the light source, the pre-dip material comprising at least one of thermally-conductive particles and a cyclo-aliphatic composition.

15. The illumination device of claim 14, wherein the pre-dip material comprises both thermally-conductive particles and the cyclo-aliphatic composition.

16. The illumination device of claim 15, wherein the pre-dip material comprises a greater amount of cyclo-aliphatic composition as compared to the thermally-conductive particles.

17. The illumination device of claim 14, wherein the pre-dip material comprises the thermally-conductive particles and wherein the pre-dip material is electrically insulative.

18. A method of manufacturing an illumination device, comprising:
    attaching a light source to a lead; and
    at least partially covering the light source with a pre-dip material such that the pre-dip material is in direct contact with the light source, the pre-dip material comprising at least one of thermally-conductive particles and a cycloaliphatic composition.

19. The method of manufacturing an illumination device according to claim 14, further comprising:
    curing the pre-dip material;
    placing the pre-dip material, the light source, and at least a portion of the lead into an outer encapsulant; and
    curing the outer encapsulant.

20. The method of manufacturing an illumination device according to claim 19, wherein the pre-dip material comprises a resin and a hardener for the resin and wherein the outer encapsulant also comprises the resin and the hardener for the resin.

\* \* \* \* \*